United States Patent [19]
Ozaki et al.

[11] Patent Number: 5,863,486
[45] Date of Patent: Jan. 26, 1999

[54] METHOD OF PROVIDING LEVELING PROPERTY TO PHOTOCURABLE RESIN COMPOSITION LAYERS IN PRODUCTION PROCESS OF THREE-DIMENSIONAL OBJECTS BY PHOTOHARDENING

[75] Inventors: Tatsuhiko Ozaki; Toshiharu Suzuki; Hirokazu Matsueda, all of Aichi, Japan

[73] Assignee: Takemoto Yushi Kabushiki Kaisha, Aichi, Japan

[21] Appl. No.: 852,917

[22] Filed: May 8, 1997

[51] Int. Cl.$^6$ .......................... B29C 35/08; B29C 41/02
[52] U.S. Cl. .......................... 264/401; 264/308; 522/90; 524/405; 524/417; 524/423; 524/425; 524/445
[58] Field of Search ..................... 264/308, 401; 522/90; 524/405, 417, 423, 425, 445

[56] References Cited

U.S. PATENT DOCUMENTS

| | | | |
|---|---|---|---|
| 4,942,066 | 7/1990 | Fan et al. | 427/553 |
| 5,002,855 | 3/1991 | Fan et al. | 430/270.1 |

FOREIGN PATENT DOCUMENTS

| | | |
|---|---|---|
| 250121 | 6/1987 | European Pat. Off. . |
| 62-101408 | 5/1987 | Japan . |
| 6-61848 | 8/1994 | Japan . |
| 6-61849 | 8/1994 | Japan . |

*Primary Examiner*—Leo B. Tentoni
*Attorney, Agent, or Firm*—Keiichi Nishimura

[57] ABSTRACT

In a process for producing a three-dimensional photohardened object by forming a layer of photocurable resin composition containing a photocurable liquid, a filler and a photoinitiator, photohardening at least a portion of this layer by exposing it to actinic radiation, and thereafter repeating the process of forming thereabove a new layer of photocurable resin composition and photohardening at least a portion of this layer by exposing it to actinic radiation, the property of the photocurable resin composition to become level can be improved by adding phosphoric acid ester of a specified structure at a specified rate.

19 Claims, No Drawings

METHOD OF PROVIDING LEVELING PROPERTY TO PHOTOCURABLE RESIN COMPOSITION LAYERS IN PRODUCTION PROCESS OF THREE-DIMENSIONAL OBJECTS BY PHOTOHARDENING

BACKGROUND OF THE INVENTION

This invention relates to a method of providing a leveling property to photocurable resin composition layers in a production process of three-dimensional objects by photohardening.

Japanese Patent Publication Tokkai 62-101408 and European Patent Publication EPA 250121 disclosed a method of forming a layer of photocurable resin composition containing a photocurable liquid and a photoinitiator, photohardening at least a portion of this layer by exposing it to actinic radiation such as an ultraviolet laser beam, thereafter repeating the process of forming thereabove a new layer of photocurable resin composition and photohardening at least a portion of this layer by exposing it to actinic radiation, and thereby forming a three-dimensional photohardened single object from continuous layers of photocurable resin composition. As disclosed in Japanese Patent Publications Tokko 6-61848 and 6-61849, photocurable resin compositions containing different kinds of fillers are also used in such a production process of three-dimensional objects for limiting the depth of invasion by the actinic radiation or for improving the physical properties of the obtained three-dimensional photohardened objects.

In such a production process of a three-dimensional photohardened object, it is important to make the surface of the photocurable resin composition layer sufficiently smooth (or to level it) before it is exposed to actinic radiation. It is because, if the layer surface is not sufficiently leveled and hence is uneven, the degree and extent of photohardening cannot be constant, depending on the position of the exposed photocurable resin composition, and this affects significantly the physical properties and shape precision of the three-dimensional object thus formed. Such a leveling process is particularly important when photocurable resin compositions containing fillers are used. The presence of a filler alone affects the leveling property of a photocurable resin composition adversely. In certain cases, the photocurable resin composition may totally lose its leveling or smoothing property.

In the past, mechanical means such as a doctor blade have been used to level the surface of a photocurable resin composition. In the case of a photocurable resin composition containing a filler, however, its layer cannot be smoothed or leveled by such mechanical means alone. It is therefore a common practice at the present time to wait for a long time for natural leveling to take place after a processing by a mechanical means. It now goes without saying that it affects the workability and productivity adversely if one has to wait for such a long time. If an actinic radiation beam is applied after waiting only a short time before the photocurable resin composition layer becomes sufficiently leveled, however, the physical properties and shape precision of the three-dimensional object thus formed become poor, as explained above. In particular, photocurable resin compositions without any leveling property cannot be used for the production of a three-dimensional object at all.

For leveling a photocurable resin composition layer containing a filler, a method of adding a photocurable monomer with a low molecular weight as a constituent photocurable liquid of the photocurable resin composition so as to reduce the overall viscosity, a method of reducing the relative content of the filler and methods of selecting the kinds of filler may be considered, but these methods alone cannot make it possible to obtain three-dimensional objects with required physical properties and shape precision, and the leveling property can be provided only to a limited extent.

SUMMARY OF THE INVENTION

It is therefore an object of this invention to overcome the problem of prior art methods that it takes a long time for leveling a photocurable resin composition layer containing a filler and that some photocurable resin compositions do not naturally become smooth at all, or do not have any leveling property.

Thus, the present invention relates to a method of providing a leveling property to photocurable resin composition layers containing fillers in the production process of three-dimensional photohardened objects.

This invention is based on the discovery by the present inventors as a result of their diligent studies that the above and other objects can be accomplished by adding a phosphoric acid ester of a specified kind by a specified ratio.

DETAILED DESCRIPTION OF THE INVENTION

In a production process of a three-dimensional photohardened object by forming a layer of photocurable resin composition containing a photocurable liquid, a filler and a photoinitiator, photohardening at least a portion of this layer by exposing it to actinic radiation, and thereafter repeating the process of forming thereabove a new layer of photocurable resin composition and photohardening at least a portion of this layer by exposing it to actinic radiation, the present invention teaches the addition of 0.1–5 weight parts of phosphoric acid ester shown by Formula 1 given below to the photocurable resin composition for each 100 weight parts of the filler contained therein so as to provide a leveling property to the photocurable resin composition layer, Formula 1 being given as follows:

(Formula 1)

where R is alkyl group with 1–15 carbon atoms, A is a residual group obtained by removing hydroxyl groups from a diol selected from the diol group consisting of polyetherdiol, polyesterdiol and polyetheresterdiol, M is H or a monovalent base, and m and n are each 1 or 2 such that m+n=3.

Formula 1 is to be understood as including acidic esters of diol with one end closed by a hydrocarbon group, as well as salts of phosphoric acid esters obtainable by neutralizing such an acidic ester of phosphoric acid with a monovalent basic compound.

In Formula 1, A is a residual group obtained by removing hydroxyl groups from a diol (hereinbelow referred to as "residual diol group"). The diols from which the residual diol group according to this invention can be obtained are polyetherdiol, polyesterdiol and polyetheresterdiol.

Examples of polyetherdiol include polyoxyethylenediol, polyoxypropylenediol, polyoxybutylenediol and polyoxyalkylenediol with two or more different oxyalkylene units. Of these examples, those with repetition number of oxyalkylene units in the range of 5–100 are preferred, and those with their repetition number in the range of 15–60 are even more preferred. In particular, those with oxyalkylene units composed of oxypropylene units and oxyethylene units at a ratio (in molar %) of 100/0–50/50 can be used advantageously.

Examples of polyesterdiol include (1) those obtainable from organic dicarboxylic acid such as aliphatic, alicyclic and aromatic dicarboxylic acids and alkanediol, (2) those obtainable by ring-opening polymerization of aliphatic lactone with 4–6 carbon atoms; and (3) those obtainable by alternate ring-opening polymerization of organic dicarboxylic acid anhydride and 1,2-epoxide. Of these examples, those with repetition number of ester units in the range of 5–100 are preferable, and those with their repetition number in the range of 15–60 are even more preferable. In particular, those obtained by ring-opening polymerization of aliphatic lactone can be used advantageously. As practical examples, one might mention polycaprolactonediol obtained by using ε-caprolactone as aliphatic lactone and causing it to undergo ring-opening polymerization and polyesterdiol obtained by using succinic anhydride, maleic anhydride and phthalic anhydride as organic dicarboxylic anhydride and causing them to undergo alternating ring-opening polymerization with 1,2-alkylene oxide.

Examples of polyetheresterdiol include those having a polyether block with a repetition of oxyalkylene units as described above and a polyester block with a repetition of ester units. Of these examples, those with a total number of oxyalkylene and ester units in the range of 5–100 are preferable and those with the total number in the range of 15–60 are even more preferred. In particular, polyoxypropylene-polycaprolactone diol obtainable by using 1,2-propylene oxide and ε-caprolactone can be used advantageously.

It is a hydrocarbon group with 1–15 carbon atoms that is used to close one end of such diol. Examples of such hydrocarbon group include (1) alkyl groups such as methyl group, ethyl group, isopropyl group, butyl group, hexyl group, nonyl group and dodecyl group, (2) cyclohexyl group, (3) phenyl group, and (4) phenyl group substituted by alkyl group with 1–9 carbon atoms such as methylphenyl group, isobutylphenyl group and nonylphenyl group. Of these examples, alkyl groups with 1–6 carbon atoms are preferred.

A known conventional method may be used to produce such polyetherdiol, polyesterdiol and polyetheresterdiol with one end closed by a hydrocarbon group. Examples of such conventional method include (1) the method of obtaining polyoxyalkylenediol with one end closed by alkyl or phenyl group by stepwise addition reaction of 1 mole of alcohol or phenol with a specified mole number of 1,2-alkylene oxide in the presence of a basic catalyst, (2) the method of obtaining polyesterdiol with one end closed by alkyl or phenyl group by reacting one mole of alcohol or phenoxyalkanol with n moles of organic dicarboxylic anhydride and more than n moles of 1,2-alkylene oxide in the presence of a catalyst such as lithium halogenid or quaternary ammonium salt, (3) the method of obtaining polyaliphatic lactonediol with one end closed by alkyl or phenyl group by stepwise ring-opening addition reaction of one mole of alcohol or phenoxyalcohol with a specified mole number of aliphatic lactone in the presence of a catalyst, and (4) the method of obtaining polyoxyalkylene polyaliphatic lactonediol with one end closed by alkyl or phenyl group by stepwise ring-opening reaction of one mole of polyoxyalkylenediol with one end closed obtained in (1) above and a specified mole number of aliphatic lactone.

Examples of phosphoric acid ester to be used according to this invention include acidic phosphoric acid monoester obtained by ester bonding of one mole of diols with a closed end and phosphoric acid, acidic phosphoric acid diester obtained by ester bonding of 2 moles of diols with a closed end and phosphoric acid, and salts of phosphoric acid esters obtained by neutralizing such acidic phosphoric acid ester with a basic compound. Such phosphoric acid esters may be produced by a known convention method. Examples of such conventional method include (1) the method of reacting 2 moles of diol with a closed end, one mole of water and one mole of phosphorus pentoxide to obtain 2 moles of acidic phosphoric acid ester, (2) the method of reacting 3 moles of diol with a closed end with one mole of phosphorus pentoxide to obtain one mole each of acidic phosphoric acid monoester and acidic phosphoric acid diester, and (3) the method of reacting 2 moles of diol with a closed end with one mole of phosphorus oxychloride followed by hydrolysis to obtain one mole of acidic phosphoric acid diester. It is also possible to obtain a salt of phosphoric acid ester by neutralizing such acidic phosphoric monoester or acidic phosphoric diester with a basic compound. Examples of basic compound which can be used for the neutralization include (1) inorganic basic compounds such as sodium hydroxide, potassium hydroxide, lithium hydroxide and ammonium hydroxide, (2) alkanol amines such as monoethanolamine, diethanolamine and triethanolamine, (3) N-alkylalkanolamines such as N-methyldiethanolamine, N-ethyldiethanolamine, and N-butyldiisopropanolamine, (4) alkylamines such as triethylamine and octyldimethylamine, (5) heterocyclic monoamines such as pyrrolidine and morpholine, and (6) onium hydroxides such as quaternary ammonium hydroxide, phosphonium hydroxide and sulfonium hydroxide. Of these phosphoric acid esters, acidic phosphoric acid esters and those salts obtained by using heterocyclic monoamine to neutralize acidic phosphoric acid ester are preferable. In particular, those containing phosphoric acid monoester by 70 molar % or more and phosphoric acid diester by 30 molar % or less are preferred.

As explained above, phosphoric acid ester as described above is caused to be contained in a photocurable resin composition comprising a photocurable liquid, a filler and a photoinitiator. The ratio of containment is 0.1–5 weight parts or preferably 0.5–3 weight parts to 100 weight parts of the filler.

According to this invention, besides phosphoric acid ester as explained above, known photocurable resin compositions containing a conventional photocurable liquid, filler and photoinitiator may be used.

Examples of photocurable liquid include vinyl monomers, unsaturated urethane, unsaturated urethane resins which are a mixture of unsaturated urethane and a vinyl monomer copolymerizable therewith, epoxy resins and vinylester resins. Of these examples, unsaturated urethane resins are preferred.

The invention does not limit the kind or structure of the unsaturated urethane serving as a constituent of such an unsaturated urethane resin. Known kinds of unsaturated urethane may be used for the purpose of this invention. Examples of such unsaturated urethane include (1) unsaturated urethane obtained (as described in Japanese Patent Publication Tokkai 4-72353) from one mole of n-hydric polyisocyanate and n moles of polyol (meth)acrylic acid partial ester obtained by esterification of polyol and (meth)acrylic acid and having one hydroxyl group in the molecule (herein referred to as (meth)acrylester monool), (2) unsaturated urethane obtained (as described in Japanese Patent Publication Tokkai 2-145616) from one mole of n-hydric polyol, n moles of diisocyanate and n moles of aforementioned (meth)acrylester monool, (3) unsaturated urethane obtained (as described in Japanese Patent Publications Tokkai 3-163116 and 6-199962) from one mole of n-hydric polyol and n moles of isocyanatoalkyl (meth)acrylate, (4) unsaturated urethane obtained (as described in Japanese Patent Publication Tokkai 4-53809) from one mole of polyol (meth)acrylic acid having n isolated hydroxyl groups in the molecule and n moles of isocyanatoalkyl (meth)acrylate, (5) unsaturated urethane having a long-chain aliphatic hydrocarbon group in the molecule (as described in Japanese Patent Publications Tokkai 4-306214, 5-339332 and 6-9729), and (6) mixtures of unsaturated urethanes described in (1)–(5) above.

Examples of vinyl monomer copolymerizable with such unsaturated urethane include (meth)acrylic acid esters and α,β-unsaturated tertiary amides.

Examples of aforementioned (meth)acrylic acid ester include (1) di(meth)acrylates of dihydric alcohol such as 1,4-butanediol di(meth)acrylate, neopentylglycol di(meth)acrylate and 1,6-hexanediol di(meth)acrylate, (2) tri(meth)acrylates of trihydric alcohol such as glycerine tri(meth)acrylate and trimethylol propane tri(meth)acrylate, (3) di(meth)acrylate of diol having alicyclic hydrocarbon group such as cyclohexane dimethanol, cyclohexene dimethanol, and dicyclopentyl dimethanol, (4) di(meth)acrylate alkoxylated bisphenols with alkoxyl group having 2–3 carbon atoms such as 2,2-bis (hydroxyethoxyphenyl) propane, 2,2-bis (hydroxy diethoxyphenyl) propane, bis (hydroxypropoxyphenyl) methane and bis (hydroxy dipropoxyphenyl) methane, (5) (poly)etherdiol di(meth)acrylate or (poly)ethertriol tri(meth)acrylate obtained from (poly) etherdiol or (poly)ethertriol with alkylene oxide with 2–4 carbon atoms added to aforementioned dihydric or trihydric alcohol and (meth)acrylic acid, and (6) (poly)esterdiol di(meth)acrylate or (poly)estertriol tri(meth)acrylate obtained from (poly)esterdiol or (poly)ester triol obtained by reacting aforementioned dihydric or trihydric alcohol with aliphatic lactone or aliphatic hydroxycarbonic acid and (meth)acrylic acid.

Examples of α, β-unsaturated tertiary amides include N-acryloyl morpholine, N-methacryloyl morpholine, N-vinylcaprolactam and N-vinylbutylolactam.

Examples of filler to be contained in a photocurable resin composition according to this invention include (1) inorganic solid particles such as silica, alumina, clay, calcium carbonate and glass beads, (2) organic solid particles such as crosslinked polystyrene, polymethyl methacrylate and polymethyl siloxane, and (3) inorganic whiskers such as potassium titanate fibers, magnesium sulfate fibers, magnesium borate fibers, aluminum borate fibers and carbon fibers. Of these examples, those comprising inorganic solid particles and inorganic whiskers are preferred.

This invention does not limit the kind or ratio of the photocurable liquid or the filler in the photocurable resin composition, but the invention is particularly effective when applied to photocurable resin compositions containing 10 weight parts or more of a filler per 100 weight parts of a photocurable liquid, and more particularly to those containing 50–400 weight parts of a filler. In this case, the invention is particularly effective if applied to photocurable resin compositions containing more than 40 weight parts of inorganic solid particles and more than 10 weight parts of inorganic whiskers serving as fillers per 100 weight parts of a photocurable liquid.

According to this invention, the relationship between the thickness of the layer of photocurable resin composition and the maximum particle diameter of the fine solid particles or the maximum fiber length of the inorganic whiskers used as the filler is also an important factor which determines efficacy. It has been found that the maximum particle diameter of fine solid particles or the maximum fiber length of the inorganic whiskers used as the filler should preferably be less than 90%, and even more preferably less than 70%, of the thickness of the layer of the photocurable resin composition to which actinic radiation is applied.

Examples of the photoinitiator to be contained in the photocurable resin composition according to this invention include (1) carbonyl compounds such as benzoin, α-methyl benzoin, anthraquinone, chloroanthraquinone and acetophenone, (2) sulfur compounds such as diphenyl sulfide, diphenyl disulfide and dithio-carbamate, and (3) polycyclic aromatic compounds such as α-chloromethyl naphthalene and anthracene. Such a photoinitiator is usually contained at a rate of 0.1–5 weight parts to 100 weight parts of the photocurable liquid.

Test examples and comparison examples will be described in what follows in order to more clearly illustrate the nature and effect of this invention, but these examples are not intended to limit the scope of the invention. In what follows, "parts" will mean "weight parts" and "%" will mean "weight %" unless specifically stated to be otherwise.

EXAMPLES

Test Part 1 (Synthesis of phosphoric acid esters)
Synthesis of phosphoric acid ester P-1:

Methoxypropanol (90 parts, or 1 mole) and potassium hydroxide flakes (0.3 parts) were taken in an autoclave. After its interior was replaced with a nitrogen gas, it was maintained at 100° C. and propylene oxide (1914 parts, or 34 moles) was pressured in with stirring over 3 hours. The reaction temperature in the meantime was maintained at 100°–110° C. The reaction was completed after holding the system at 100° C. for 30 minutes. After the reaction product thus obtained was neutralized with an aqueous solution of phosphoric acid, it was dehydrated to obtain 2000 weight parts of methoxy•polyoxypropylenediol (with average molecular weight 2000, average repetition number of oxypropylene units in one molecule 35). The water content of this methoxy•polyoxypropylenediol thus obtained was 0.2%.

Next, this methoxy•polyoxypropylenediol (400 parts, or 0.2 moles) and water (2.8 parts, or 0.156 moles) were taken inside a reaction vessel, and phosphorus pentoxide $P_2O_5$ (14.2 parts, or 0.1 mole) was slowly added with stirring over 30 minutes while the mixture was kept at 50° C. The reaction temperature in the meantime was kept at 50°–60° C. Thereafter, the system was kept for one hour at 50°–55° C. to complete the synthesis to obtain 544 parts of phosphoric acid ester P-1 comprising acidic phosphoric acid ester. Phosphoric acid ester P-1 thus obtained was subjected to alkalimetry by means of a potentiometric titrator to calculate the ratio between acidic phosphoric acid monoester and acidic phosphoric acid diester from the titration number at each neutralization point. The result was 92 molar % for mono(methoxy•polyoxypropylenediol) acidic phosphoric acid ester and 8 molar % for di(methoxy•polyoxypropylenediol) acidic phosphoric acid ester.

Synthesis of phosphoric acid ester P-2:
Phosphoric acid ester P-2 was obtained similarly to phosphoric acid ester P-1. (See Table 1 below).

Synthesis of phosphoric acid ester P-3:
Nonylphenol (440 parts, or 2 moles) and tetra-n-butyl titanate (0.68 parts, or 0.002 moles) were taken inside a reaction vessel, and ε-caprolactone (5928 parts, or 52 moles) was added with stirring over a period of 5 hours while the temperature was held at 70° C. In the meantime, the reaction temperature was maintained at 100°–120° C. The system was thereafter kept at 120° C. for one hour to complete the synthesis to obtain 6505 parts of mononolylphenoxy polycaprolactonediol (with average molecular weight 3150 and average repetition number of ester units 26).

Next, this mononolylphenoxy polycaprolactonediol (945 parts, or 0.3 moles) and phosphorus pentoxide (14.2 parts, or 0.1 mole) were used to obtain 959 parts of phosphoric acid ester P-3 comprising acidic phosphoric acid as done in the synthesis of phosphoric acid ester P-1. Alkalimetry was carried out on phosphoric acid ester P-3 as described above to discover that there were 55 molar % of mono (nonylphenoxy polycaprolactonediol) acidic phosphoric acid ester and 45 molar % of di(nonylphenoxy polycaprolactonediol) acidic phosphoric acid ester.

Synthesis of phosphoric acid ester P-4:

cyclohexyl alcohol (96 parts, or 1 mole) and potassium hydroxide flakes (0.3 parts) were taken inside an autoclave, and after its interior was replaced with nitrogen gas, propylene oxide (585 parts, or 10 moles) was pressured in over a period of 3 hours with the temperature kept at 100° C. The reaction temperature in the meantime was kept at 100°–110° C. The reaction was completed thereafter by keeping the system at 100° C. for 30 minutes. After the reaction product thus obtained was neutralized with an aqueous solution of phosphoric acid, it was dehydrated and filtered to obtain 672 parts of cyclohexaxy•polyoxypropylenediol (with average molecular weight 676 and average repetition number of oxypropylene units in one molecule 10). Cyclohexaxy•polyoxypropylenediol thus obtained (338 parts, or 0.5 moles) and tetra-n-butyl titanate (0.34 parts, or 0.001 mole) were taken inside a reaction vessel and maintained at 120° C. while ε-caprolactone (570 parts, or 5 moles) was dropped in over a period of 5 hours with stirring. In the meantime, the reaction temperature was maintained at 120°–130° C. The system was kept thereafter at 130° C. for one hour to complete the synthesis and to obtain 900 parts of monocyclohexaxy•polyoxypropylene polycaprolactonediol (with average molecular weight 1810, average repetition number of oxypropylene units 10 and average repetition number of ester units 10).

Next, monocyclohexaxy•polyoxypropylene polycaprolactonediol thus obtained (543 parts, or 0.3 moles) and phosphorus pentoxide (14.2 parts, or 0.1 mole) were used, as in the synthesis of phosphoric acid ester P-1, to obtain 557 parts of a phosphoric acid ester. Alkalimetry was carried out thereon as described above and it was discovered that there were 55 molar % of mono(cyclohexaxy polycaprolactonediol) acidic phosphoric acid ester and 45 molar % of di(cyclohexaxy polycaprolactonediol) acidic phosphoric acid ester. Phosphoric acid ester P-4 was obtained by neutralizing this acidic phosphoric acid ester with triethylamine.

Synthesis of phosphoric acid ester P-5:

Phosphoric acid ester P-5 was obtained by neutralizing phosphoric acid ester P-1 (methoxy•polyoxypropylenediol acidic phosphoric acid ester) with morpholine.

Table 1 below summarizes phosphoric acid esters P-1–P-5 thus synthesized.

TABLE 1

| | Diol with a closed end | | | Phosphoric ester | |
|---|---|---|---|---|---|
| Kind | Oxyalkylene unit | Ester unit | End-closing group | Mono/di- (Molar ratio) | M |
| P-1 | Oxypropylene RN = 35 | — | Methyl | 92/8 | H |
| P-2 | Oxypropylene/ Oxyethylene RN = 16/9 | — | Butyl | 70/30 | H |
| P-3 | — | 5-oxycaproyl RN = 26 | Nonyl- phenyl | 55/45 | H |
| P-4 | Oxypropylene RN = 10 | 5-oxycaproyl RN = 10 | Cyclo- hexyl | 55/45 | Tri- ethyl amine |
| P-5 | Oxypropylene RN = 35 | — | Methyl | 92/8 | Morpho- line |

In Table 1:

Kinds and repetition numbers (RN) of oxyalkylene and ester units are shown for each kind of phosphoric acid ester.

Mono/di: Ratio of monoester and diester

M: As appearing in Formula 1.

Test Part 2 (Preparation of photocurable resin compositions)

Preparation of compositions C-1–C-8 and R-1–R-5:

Photocurable liquid A-1 (100 parts) composed of 60 parts of unsaturated urethane synthesized by the method described in Japanese Patent Publication Tokkai 4-53809 (by reacting 2,4-tolylene diisocyanate, glycerine monoacrylate monomethacrylate and 2-hydroxylethylacrylate at molar ratio of 1/1/1) and 40 parts of N-acryloyl morpholine and 5 parts of a photoinitiator were mixed and dissolved at room temperature. Inorganic whiskers (30 parts) and inorganic fine solid particles (100 parts) as filler and phosphoric acid ester P-1 (2 parts) were added thereto to prepare photocurable resin composition C-1 with composition shown in Table 2. Photocurable resin compositions C-2–C-8 and R-1–R-5 were similarly prepared.

TABLE 2

| Kind | Photocurable liquid | Photo-Initiator | Inorganic whisker | Inorganic solid fine particles | Phosphoric acid ester |
|---|---|---|---|---|---|
| C-1 | A-1 (100) | B-1 (5) | D-1 (30) | E-1 (100) | P-1 (2) |
| C-2 | A-1 (100) | B-1 (5) | D-2 (50) | E-1 (200) | P-2 (3) |
| C-3 | A-1 (100) | B-1 (5) | D-2 (50) | E-1 (200) | P-3 (3) |
| C-4 | A-1 (100) | B-1 (5) | D-2 (50) | E-1 (200) | P-4 (3) |
| C-5 | A-2 (100) | B-2 (5) | D-1 (50) | E-1 (100) | P-2 (2) |
| C-6 | A-2 (100) | B-2 (5) | D-2 (30) | E-3 (100) | P-2 (2) |
| C-7 | A-3 (100) | B-1 (5) | D-1 (30) | E-1 (100) | P-1 (2) |
| C-8 | A-1 (100) | B-1 (5) | D-1 (30) | E-1 (100) | P-5 (3) |
| R-1 | A-1 (100) | B-1 (5) | D-1 (30) | E-1 (100) | — — |
| R-2 | A-1 (100) | B-1 (5) | D-2 (50) | E-1 (200) | — — |
| R-3 | A-2 (100) | B-2 (5) | D-1 (50) | E-1 (100) | — — |
| R-4 | A-2 (100) | B-2 (5) | D-2 (30) | E-3 (100) | — — |
| R-5 | A-3 (100) | B-1 (5) | D-1 (30) | E-1 (100) | — — |

In Table 2, the numbers inside () are weight parts.

A-1: Unsaturated urethane resin composed of 60 weight parts of unsaturated urethane obtained by reacting 2,4-tolylene diisocyanate, glycerine monoacrylate monomethacrylate and 2-hydroxyethylacrylate at molar ratio of 1/1/1 and 40 weight parts of N-acryloyl morpholine;

A-2: Unsaturated urethane resin composed of 60 weight parts of unsaturated urethane obtained by reacting 2,4-tolylene diisocyanate, glycerine monomethacrylate monooctanoate and 2-hydroxyethylacrylate at molar ratio of 1/1/1 and 40 weight parts of N-acryloyl morpholine;

A-3: Unsaturated urethane resin composed of 50 weight parts of unsaturated urethane obtained by reacting polypropyleneglycol with molecular weight 300, isophorone diisocyanate and 2-hydroxyethylacrylate at molar ratio of 1/2/2 and 40 weight parts of neopentylglycol hydroxypivalate diacrylate;

B-1: 1-hydroxy cyclohexylphenyl ketone (Irgacure 184 produced by CIBA-Geigy, Ltd.);

B-2: Benzyl dimethylketale (Irgacure 651 produced by CIBA Geigy, Ltd.);

D-1: Aluminum borate whisker with average fiber length 15 µm and maximum fiber length 30 µm (ALBOREX Y produced by Shikoku Kasei, Ltd.);

D-2: Aluminum borate whisker with surface processed with 3-methacryloxy propyltrimethoxysilane with average fiber length 15 µm and maximum fiber length 30 µm (ALBOREX YS-4 produced by Shikoku Kasei, Ltd.);

E-1: Glass beads with average particle diameter 15 µm and maximum particle diameter 35 µm (GB-210C produced by Toshiba Ballotini Co., Ltd.);

E-2: Glass beads with average particle diameter 10 µm and maximum particle diameter 25 µm (MB-20 produced by Toshiba Ballotini Co., Ltd.);

E-3: Aluminum hydroxide with average particle diameter 8 µm and maximum particle diameter 20 µm (B-103 produced by Nippon Light Metal Co., Ltd.).

Test Part 3

Test Examples 1–8 and Comparison Examples 1–5

Use was made of an apparatus for stereolithography composed mainly of a three-dimensional numerically controlled table provided with a container and an argon laser beam (output 25 mW and wavelength 325 nm) control system, with the container filled with a photocurable resin composition prepared in Test Part 2. A platform attached to the container was moved vertically to place the composition on a horizontal surface (defined by X-Y axes) and a layer was formed with a doctor blade such that a thickness of 100 µm is obtained. A lattice pattern of red light (with wavelength 630 nm) with intervals 5 mm and line width 1 mm was projected on the X-Y plane of this layer. After the doctor blade was stopped, the layer was allowed to level down until the lattice pattern stopped moving. Thereafter, a convergent argon laser beam from a direction perpendicular to the X-Y plane (the direction of the Z-axis) was applied over a specified area so as to harden the layer. Next, another photocurable resin composition layer was produced over this photohardened area such that its thickness would become 100 µm by repeating the process described above. The newly formed layer was photohardened similarly after it was allowed to level down. This process was repeated until ten such layers were stacked one on top of another to form a structure with dimensions 100 mm, 50 mm and 1 mm respectively in the direction of the X, Y and Z axes. The total wait time required to produce such a structure during which each layer is allowed to level down is shown in Table 3.

TABLE 3

| Example | Type of photocurable resin composition | Total wait time (Sec) |
| --- | --- | --- |
| Test Examples | | |
| 1 | C-1 | 90 |
| 2 | C-2 | 196 |
| 3 | C-3 | 262 |
| 4 | C-4 | 233 |
| 5 | C-5 | 152 |
| 6 | C-6 | 122 |
| 7 | C-7 | 137 |
| 8 | C-8 | 86 |
| Comparison Examples | | |
| 1 | R-1 | 1050 |
| 2 | R-2 | No leveling |
| 3 | R-3 | 2440 |
| 4 | R-4 | 1560 |
| 5 | R-5 | 2020 |

Test Part 4

Test Examples 9–16 and Comparison Examples 5–10

Use was made of the same apparatus as in Test Part 3 and operated also as in Test Part 3 to photoharden the photocurable resin compositions prepared in Test Part 2 except the thickness of each layer was 50 µm and the wait time after each layer was formed until the argon laser beam was applied was set to 30 seconds to form a total of 40 layers to produce three-dimensional structures with dimensions 55 mm×10 mm×2 mm. On each of these structures, 26 test points were selected in the center area in the direction of the Y-axis and at intervals of 2 mm in the direction of the X-axis, and the height of these 26 points were measured by a surface analyzer. From these measurements, the maximum deviation in the height and standard deviation were obtained. The surface condition was also investigated visually. With Comparison Examples 6, 8–10, the layers of photocurable resin compositions did not level down but they were forcibly photohardened to obtain a three-dimensional structure for the testing. With Comparison Example 7, however, a photocurable resin composition layer itself could not be formed and hence no three-dimensional structure could be obtained for the measurement. Table 4 shows the results of these tests.

For the evaluation by visual testing, the following symbols are used:

A: Smooth with lustre;

B: Smooth but no lustre;

C: Unevenness was observed;

D: Coarse surface with unevenness.

These tests clearly show that the method according to this invention can provide photocurable resin compositions having improved workability and productivity, capable of producing three-dimensional photohardened structures with superior physical properties.

TABLE 4

| Example | Type of photocurable resin composition | Maximum variation (µm) | Standard variation (µm) | Result of visual testing |
| --- | --- | --- | --- | --- |
| Test Examples | | | | |
| 9 | C-1 | 4 | 1.9 | A |
| 10 | C-2 | 5 | 2.4 | A |

TABLE 4-continued

| Example | Type of photocurable resin composition | Maximum variation ($\mu$m) | Standard variation ($\mu$m) | Result of visual testing |
|---|---|---|---|---|
| 11 | C-3 | 9 | 3.3 | B |
| 12 | C-4 | 8 | 3.1 | B |
| 13 | C-5 | 4 | 2.0 | A |
| 14 | C-6 | 4 | 1.9 | A |
| 15 | C-7 | 4 | 2.0 | A |
| 16 | C-8 | 4 | 1.8 | A |
| Comparison Examples | | | | |
| 6 | R-1 | 16 | 7.2 | C |
| 7 | R-2 | — | — | — |
| 8 | R-3 | 21 | 9.5 | D |
| 9 | R-4 | 17 | 8.0 | C |
| 10 | R-5 | 20 | 8.9 | C |

What is claimed is:

1. In a process for producing a three-dimensional photo-hardened object by forming a layer of photocurable resin composition containing a photocurable liquid, a filler and a photoinitiator, photohardening at least a portion of said layer by applying actinic radiation thereto, and thereafter repeating the process of forming thereabove a new layer of photocurable resin composition and photohardening at least a portion of said new layer by application of said actinic radiation to thereby produce a three-dimensional photohardened object, the improvement wherein said process includes the step of improving leveling property of said layer of said photocurable resin composition by adding 0.1–5 weight parts of phosphoric acid ester shown by Formula 1 given below to said photocurable resin composition for 100 weight parts of said filler contained therein, said Formula 1 being given as follows:

(Formula 1)

where R is alkyl group with 1–15 carbon atoms, A is a residual group obtained by removing hydroxyl groups from a diol selected from the diol group consisting of polyetherdiol, polyesterdiol and polyetheresterdiol, M is H or a monovalent base, and m and n are each 1 or 2 such that m+n=3.

2. The improvement of claim 1 wherein A in said Formula 1 represents a residual group obtained by removing hydroxyl groups from polyetherdiol with repetition number of oxyalkylene units 5–100.

3. The improvement of claim 2 wherein said oxyalkylene units consist of oxypropylene units or oxyethylene units and oxypropylene units at molar ratio of 100/0–50/50 in molar %.

4. The improvement of claim 1 wherein said phosphoric acid ester shown by said Formula 1 is alkoxypolyether acidic phosphoric acid ester having alkoxy group with 1–6 carbon atoms.

5. The improvement of claim 2 wherein said phosphoric acid ester shown by said Formula 1 is alkoxypolyether acidic phosphoric acid ester having alkoxy group with 1–6 carbon atoms.

6. The improvement of claim 1 wherein said phosphoric acid ester shown by said Formula 1 is a salt obtained by neutralizing alkoxypolyether acidic phosphoric acid ester having alkoxy group with 1–6 carbon atoms with heterocyclic monoamine.

7. The improvement of claim 2 wherein said phosphoric acid ester shown by said Formula 1 is a salt obtained by neutralizing alkoxypolyether acidic phosphoric acid ester having alkoxy group with 1–6 carbon atoms with heterocyclic monoamine.

8. The improvement of claim 1 wherein said filler includes inorganic fine solid particles and inorganic whiskers.

9. The improvement of claim 2 wherein said filler includes inorganic fine solid particles and inorganic whiskers.

10. The improvement of claim 4 wherein said filler includes inorganic fine solid particles and inorganic whiskers.

11. The improvement of claim 5 wherein said filler includes inorganic fine solid particles and inorganic whiskers.

12. The improvement of claim 6 wherein said filler includes inorganic fine solid particles and inorganic whiskers.

13. The improvement of claim 7 wherein said filler includes inorganic fine solid particles and inorganic whiskers.

14. The improvement of claim 1 wherein said photocurable liquid comprises unsaturated urethane resin.

15. The improvement of claim 2 wherein said photocurable liquid comprises unsaturated urethane resin.

16. The improvement of claim 4 wherein said photocurable liquid comprises unsaturated urethane resin.

17. The improvement of claim 5 wherein said photocurable liquid comprises unsaturated urethane resin.

18. The improvement of claim 6 wherein said photocurable liquid comprises unsaturated urethane resin.

19. The improvement of claim 7 wherein said photocurable liquid comprises unsaturated urethane resin.

* * * * *